(12) United States Patent
Endo et al.

(10) Patent No.: US 7,094,521 B2
(45) Date of Patent: Aug. 22, 2006

(54) PATTERN FORMATION METHOD AND EXPOSURE SYSTEM

(75) Inventors: Masayuki Endo, Osaka (JP); Masaru Sasago, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 265 days.

(21) Appl. No.: 10/640,061

(22) Filed: Aug. 14, 2003

(65) Prior Publication Data
US 2004/0224265 A1    Nov. 11, 2004

(30) Foreign Application Priority Data
May 9, 2003   (JP) .............................. 2003-131161

(51) Int. Cl.
G03F 7/00     (2006.01)
G03F 7/20     (2006.01)

(52) U.S. Cl. ...................................... 430/322; 430/395

(58) Field of Classification Search ................ 430/322, 430/395
See application file for complete search history.

(56) References Cited

U.S. PATENT DOCUMENTS 5,900,354 A    5/1999  Batchelder ................. 430/395
6,083,664 A *  7/2000  Inno et al. ................. 430/302
2005/0037269 A1* 2/2005  Levinson .................... 430/30

FOREIGN PATENT DOCUMENTS

JP    P2001-316863    11/2001

OTHER PUBLICATIONS

M. Switkes and M. Rothschild, "Immersion lithography at 157 nm", J. Vac. Sci. Technol., B19, 2353 (2001)).

* cited by examiner

Primary Examiner—Nicole Barreca
(74) Attorney, Agent, or Firm—McDermott Will & Emery LLP

(57) ABSTRACT

After forming a resist film made from a chemically amplified resist material, pattern exposure is carried out by irradiating the resist film with exposing light while supplying, between a projection lens and the resist film, a solution of water (having a refractive index of 1.44) that includes an antifoaming agent and is circulated and temporarily stored in a solution storage. After the pattern exposure, the resist film is subjected to post-exposure bake, and the resultant resist film is developed with an alkaline developer. Thus, a resist pattern made of an unexposed portion of the resist film can be formed in a good shape.

5 Claims, 7 Drawing Sheets

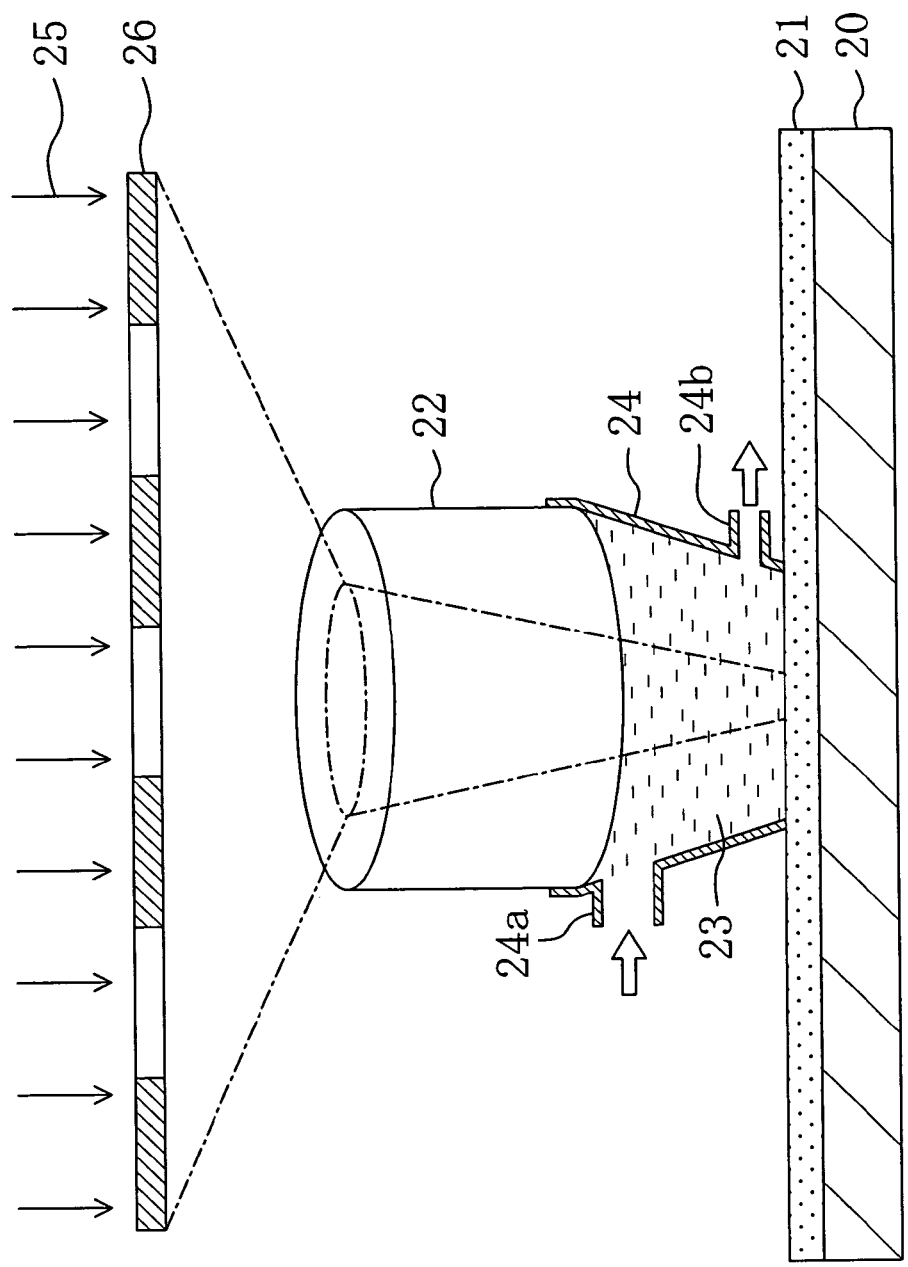

PATTERN FORMATION METHOD AND EXPOSURE SYSTEM

BACKGROUND OF THE INVENTION

The present invention relates to a pattern formation method for use in semiconductor fabrication and an exposure system employing the pattern formation method.

In accordance with the increased degree of integration of semiconductor integrated circuits and downsizing of semiconductor devices, there are increasing demands for further rapid development of lithography technique. Currently, pattern formation is carried out through photolithography using exposing light of a mercury lamp, KrF excimer laser, ArF excimer laser or the like, and use of $F_2$ laser lasing at a shorter wavelength is being examined. However, since there remain a large number of problems in exposure systems and resist materials, photolithography using exposing light of a shorter wavelength has not been put to practical use.

In these circumstances, immersion lithography has recently been proposed for realizing further refinement of patterns by using conventional exposing light (M. Switkes and M. Rothschild, "Immersion lithography at 157 nm", J. Vac. Sci. Technol., B19, 2353 (2001)).

In the immersion lithography, a region in an exposure system sandwiched between a projection lens and a resist film formed on a wafer is filled with a solution having a refractive index n, and therefore, the NA (numerical aperture) of the exposure system has a value n·NA. As a result, the resolution of the resist film can be improved.

Now, a conventional pattern formation method using the immersion lithography will be described with reference to FIGS. 7A through 7D.

First, a chemically amplified resist material having the following composition is prepared:

| | |
|---|---|
| Base polymer: poly((norbornene-5-methylene-t-butylcarboxylate) – (maleic anhydride)) (wherein norbornene-5-methylene-t-butylcarboxylate:maleic anhydride = 50 mol %:50 mol %) | 2 g |
| Acid generator: trifluorosulfonium triflate | 0.04 g |
| Solvent: propylene glycol monomethyl ether acetate | 20 g |

Next, as shown in FIG. 7A, the aforementioned chemically amplified resist material is applied on a substrate 1 so as to form a resist film 2 with a thickness of 0.35 μm.

Then, as shown in FIG. 7B, while supplying water 3 onto the resist film 2, pattern exposure is carried out by irradiating the resist film 2 with exposing light 4 of ArF excimer laser with NA of 0.65 through a mask 5. Although a projection lens for projecting the exposing light 4 having passed through the mask 5 on the surface of the resist film 2 is not shown in FIG. 7B, a region sandwiched between the projection lens and the resist film 2 is filled with the water 3. Thus, an exposed portion 2a of the resist film 2 becomes soluble in an alkaline developer because an acid is generated from the acid generator therein while an unexposed portion 2b of the resist film 2 remains insoluble in an alkaline developer because no acid is generated from the acid generator therein.

After the pattern exposure, as shown in FIG. 7C, the resist film 2 is baked with a hot plate at a temperature of 110° C. for 60 seconds, and the resultant resist film is developed with a 2.38 wt % tetramethylammonium hydroxide developer (alkaline developer). In this manner, a resist pattern 6 made of the unexposed portion 2b of the resist film 2 can be obtained as shown in FIG. 7D.

However, as shown in FIG. 7D, the resist pattern 6 formed by the conventional method is in a defective shape.

The present inventors have examined the reason why the resist pattern 6 formed by the conventional method is in a defective shape, resulting in finding the following: When a stage of the exposure system for holding the substrate 1 moves, foams are formed within the solution 3, and the foams scatter the exposing light 4. As a result, the exposing light 4 reaches the unexposed portion 2b of the resist film 2 or the exposed portion 2a of the resist film 2 is excessively exposed. This causes the defect in the shape of the resist pattern 6.

When a resist pattern in such a defective shape is used for etching a target film, the resultant pattern is also in a defective shape, which disadvantageously lowers the productivity and the yield in the fabrication process for semiconductor devices.

SUMMARY OF THE INVENTION

In consideration of the aforementioned conventional problem, an object of the invention is forming a resist pattern in a good shape by reducing foams formed in a solution used for the immersion lithography.

In order to achieve the object, the first pattern formation method of this invention includes the steps of performing pattern exposure by selectively irradiating a resist film with exposing light while supplying a solution including an antifoaming agent onto the resist film; and forming a resist pattern by developing the resist film after the pattern exposure.

In the first pattern formation method, even when foams are formed in the solution supplied onto the resist film, the foams are vanished by the antifoaming agent. Therefore, the exposing light can be prevented from scattering, so that the resist pattern can be formed in a good shape.

The second pattern formation method of this invention includes the steps of performing pattern exposure by selectively irradiating a resist film with exposing light while supplying a solution onto the resist film; and forming a resist pattern by developing the resist film after the pattern exposure, and in the step of performing pattern exposure, the solution supplied onto the resist film is temporarily stored in a solution storage that is provided between the resist film and a lens used for projecting the exposing light to the resist film and has an inlet for allowing the solution to flow in and an outlet, having a cross-sectional area smaller than the inlet, for allowing the solution to flow out.

In the second pattern formation method, since the outlet for allowing the solution to flow out of the solution storage has a smaller cross-sectional area then the inlet for allowing the solution to flow into the solution storage, the pressure of the solution temporarily stored in the solution storage is high. Therefore, the size of foams formed in the solution supplied onto the resist film is reduced and the formed foams are rapidly vanished. Accordingly, the exposing light can be prevented from scattering, so that the resist pattern can be formed in a good shape.

In the first or second pattern formation method, the solution supplied onto the resist film is preferably water.

When water having a high refractive index is used as the solution, a value n·NA can be definitely increased.

In the first or second pattern formation method, the solution supplied onto the resist film is preferably perfluoropolyether.

When perfluoropolyether is used as the solution, even if a water-soluble film is formed on the resist film, the water-soluble film can be prevented from being dissolved in the solution.

In the second pattern formation method, the solution supplied onto the resist film preferably includes an antifoaming agent.

Thus, the foams formed in the solution supplied onto the resist film can be more rapidly vanished.

In the first or second pattern formation method, in the case where the solution supplied onto the resist film includes an antifoaming agent, the antifoaming agent is preferably silicone oil, fatty acid, phosphoric ester, vegetable fat, glycerol fatty ester, calcium carbonate, magnesium carbonate, lecithin or polyether.

Thus, the foams formed in the solution can be definitely vanished.

The exposure system of this invention includes a lens for projecting, on a resist film, exposing light having passed through a mask; a solution storage provided between the resist film and the lens for temporarily storing a solution through which the exposing light having been projected by the lens passes before reaching the resist film; an inlet for allowing the solution to flow into the solution storage; and an outlet for allowing the solution temporarily stored in the solution storage to flow out of the solution storage.

In the exposure system of this invention, a region in the exposure system sandwiched between a projection lens and a resist film can be filled with a solution having a refractive index n. Therefore, the value of the NA (numerical aperture) of the exposure system can be increased to n·NA, so as to improve the resolution of the resist film.

In the exposure system of this invention, the outlet preferably has a smaller cross-sectional area than the inlet.

When the outlet for allowing the solution to flow out of the solution storage has a smaller cross-sectional area than the inlet for allowing the solution to flow into the solution storage, the pressure of the solution temporarily stored in the solution storage is high. Therefore, the size of foams formed in the solution supplied onto the resist film can be reduced and the formed foams can be rapidly vanished. Accordingly, the exposing light can be prevented from scattering, so that a resist pattern can be formed in a good shape.

BRIEF DESCRIPTION OF THE DRAWINGS

FIG. 4 is a cross-sectional view of a principal part of a second exposure system used in a pattern formation method according to Embodiment 3 or 4 of the invention;

DETAILED DESCRIPTION OF THE INVENTION

Embodiment 1

First, a first exposure system used in a pattern formation method according to Embodiment 1 will be described with reference to FIG. 1.

Figure 1:
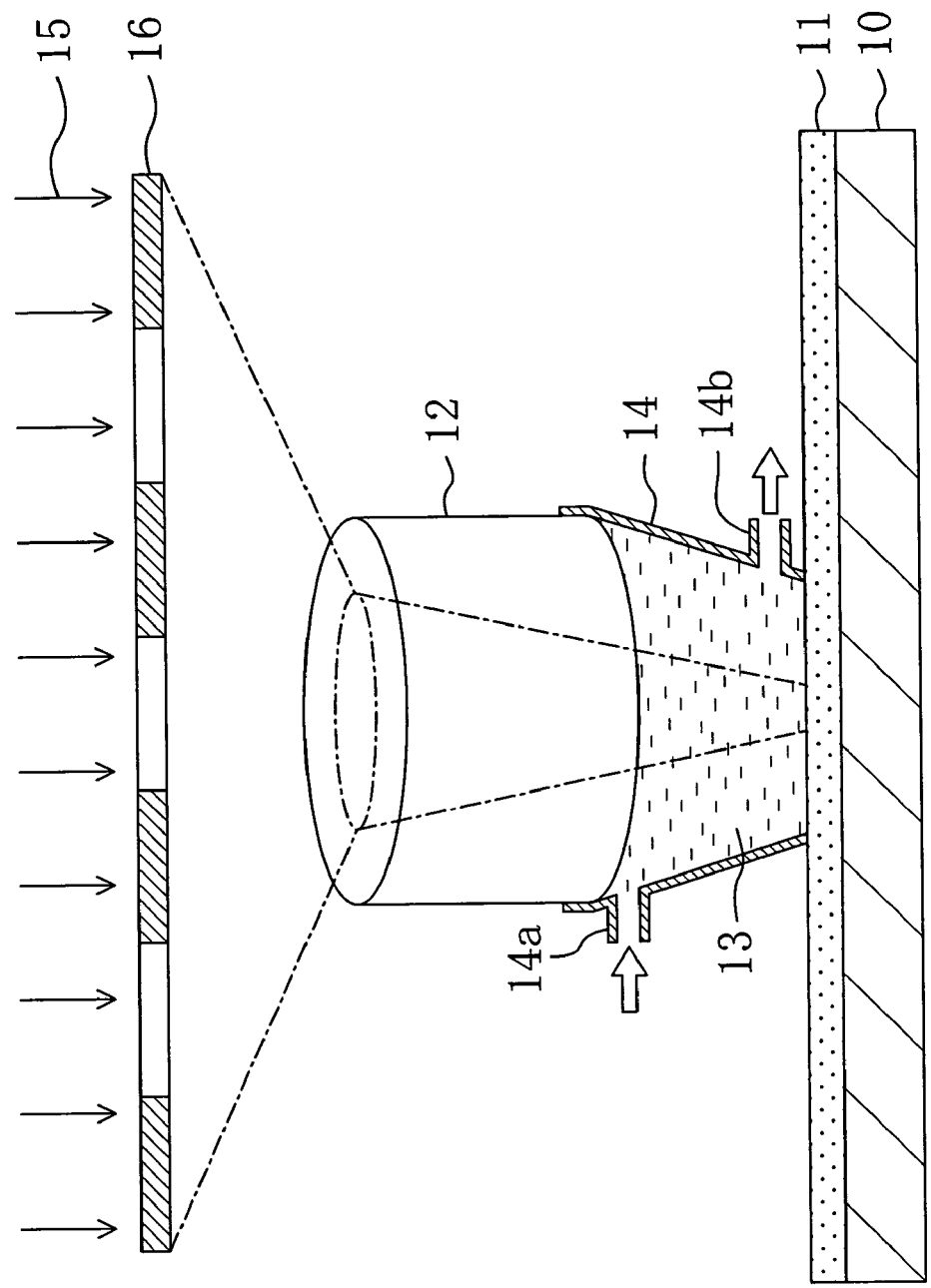
FIG. 1 is a cross-sectional view of a principal part of a first exposure system used in a pattern formation method according to Embodiment 1 or 2 of the invention.

As shown in FIG. 1, a projection lens 12 of the first exposure system is provided above a resist film 11 formed on a semiconductor substrate 10, and a solution storage 14 for storing a solution 13 (with a refractive index n) is provided between the projection lens 12 and the resist film 11. The solution storage 14 is provided with an inlet 14a for allowing the solution 13 to flow into and an outlet 14b for allowing the solution 13 to flow out of the solution storage 14, and the solution 13 having flown into the solution storage 14 through the inlet 14a is temporarily stored in the solution storage 14 and then flows out through the outlet 14b. Accordingly, exposing light 15 passes through a mask 16 having a desired pattern and is then projected by the projection lens 12 so as to reach the surface of the resist film 11 through the solution 13. Therefore, the numerical aperture NA of the exposing light that reaches the surface of the resist film 11 through the solution 13 has a value "n" times as large as that attained when the exposing light reaches without passing through the solution 13.

The pattern formation method according to Embodiment 1 of the invention will now be described with reference to FIGS. 2A through 2D.

First, a positive chemically amplified resist material having the following composition is prepared:

| | |
|---|---|
| Base polymer: poly((norbornene-5-methylene-t-butylcarboxylate) – (maleicanhydride)) (wherein norbornene-5-methylene-t-butylcarboxylate:maleic anhydride = 50 mol %:50 mol %) | 2 g |
| Acid generator: trifluorosulfonium triflate | 0.04 g |
| Solvent: propylene glycol monomethyl ether acetate | 20 g |

Figure 2A:
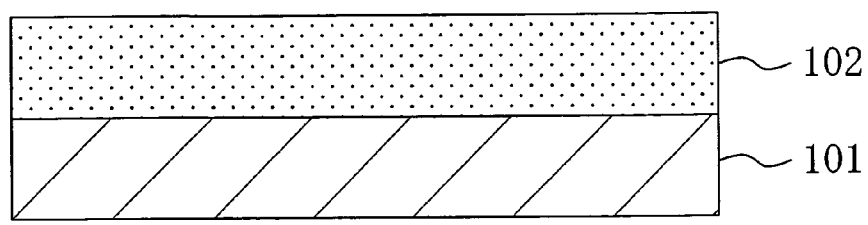
FIGS. 2A, 2B, 2C and 2D are cross-sectional views for showing procedures in the pattern formation method according to Embodiment 1 of the invention.

Next, as shown in FIG. 2A, the aforementioned chemically amplified resist material is applied on a substrate 101 so as to form a resist film 102 with a thickness of 0.35 μm.

Figure 2B:
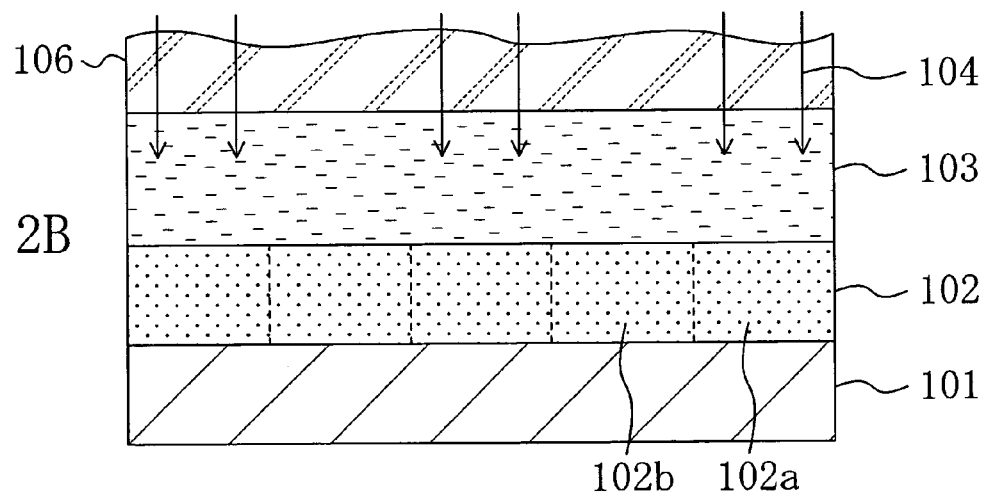

Then, as shown in FIG. 2B, while supplying, between a projection lens 106 and the resist film 102, a solution 103 of water (having a refractive index n of 1.44) that includes 100 p.p.m. of silicone oil working as an antifoaming agent and is circulated and temporarily stored in the solution storage 14 (shown in FIG. 1), pattern exposure is carried out by irradiating the resist film 102 with exposing light 104 of ArF excimer laser with NA of 0.65 through a mask not shown. Thus, an exposed portion 102a of the resist film 102 becomes soluble in an alkaline developer because an acid is generated from the acid generator therein while an unexposed portion 102b of the resist film 102 remains insoluble in an alkaline developer because no acid is generated from the acid generator therein.

Figure 2C:
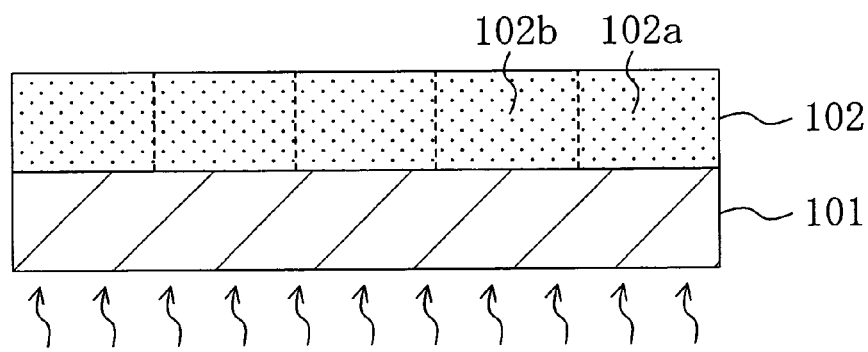
Figure 2D:
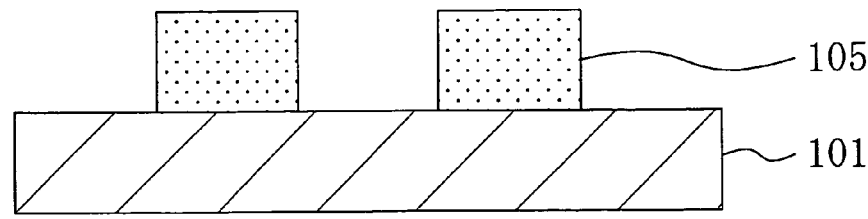

After the pattern exposure, as shown in FIG. 2C, the resist film 102 is baked with a hot plate at a temperature of 100° C. for 60 seconds, and the resultant resist film is developed with a 2.38 wt % tetramethylammonium hydroxide developer (alkaline developer). In this manner, a resist pattern 105 made of the unexposed portion 102b of the resist film 102 and having a line width of 0.09 μm can be formed in a good shape as shown in FIG. 2D.

In Embodiment 1, since the solution 103 includes the antifoaming agent, foams formed in moving a stage for holding the substrate 101 can be vanished by the antifoaming agent. As a result, the exposing light 104 can be prevented from scattering, so that the resist pattern 105 can be formed in a good shape.

Embodiment 2

A pattern formation method according to Embodiment 2 of the invention will now be described with reference to FIGS. 1 and 3A through 3D. In the pattern formation method of Embodiment 2, the first exposure system shown in FIG. 1 is used as in Embodiment 1.

First, a negative chemically amplified resist material having the following composition is prepared:

| | |
|---|---|
| Base polymer: poly((norbornene-5-methylenecarboxylate) – (maleic anhydride)) (wherein norbornene-5-methylenecarboxylate:maleic anhydride = 50 mol %:50 mol %) | 2 g |
| Crosslinking agent: 1,3,5-N-(trihydroxymethyl)melamine | 0.7 g |
| Acid generator: trifluorosulfonium triflate | 0.04 g |
| Solvent: propylene glycol monomethyl ether acetate | 20 g |

Figure 3A:
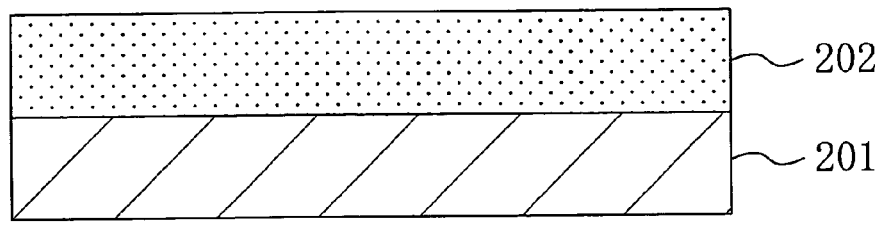
FIGS. 3A, 3B, 3C and 3D are cross-sectional views for showing procedures in the pattern formation method according to Embodiment 2 of the invention.

Next, as shown in FIG. 3A, the aforementioned chemically amplified resist material is applied on a substrate 201 so as to form a resist film 202 with a thickness of 0.35 μm.

Figure 3B:
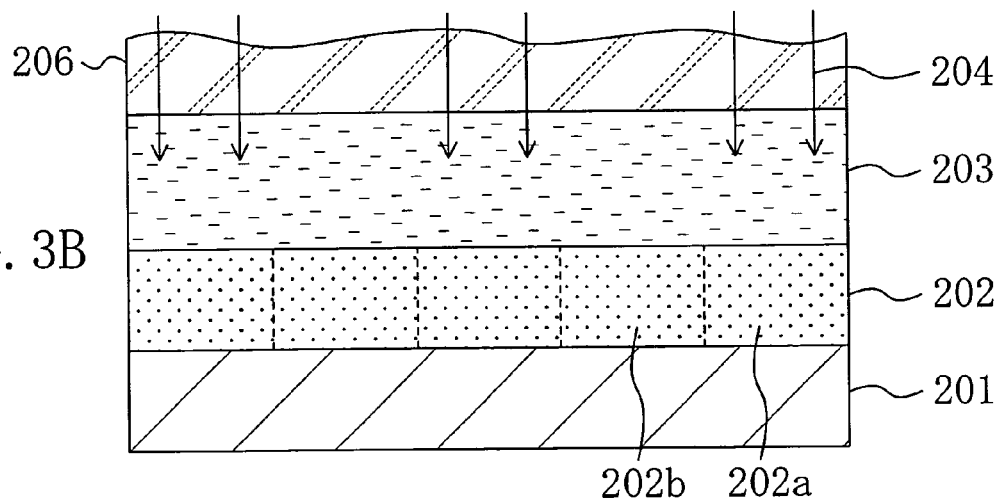

Then, as shown in FIG. 3B, while supplying, between a projection lens 206 and the resist film 202, a solution 203 of water (having a refractive index n of 1.44) that includes 100 p.p.m. of silicone oil working as an antifoaming agent and is circulated and temporarily stored in the solution storage 14 (shown in FIG. 1), pattern exposure is carried out by irradiating the resist film 202 with exposing light 204 of ArF excimer laser with NA of 0.65 through a mask not shown. Thus, an exposed portion 202a of the resist film 202 becomes insoluble in an alkaline developer due to the function of the crosslinking agent because an acid is generated from the acid generator therein while an unexposed portion 202b of the resist film 202 remains soluble in an alkaline developer because no acid is generated from the acid generator therein.

Figure 3C:
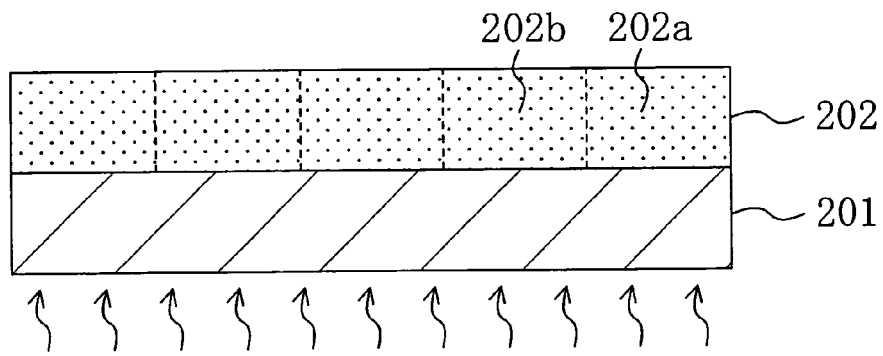
Figure 3D:
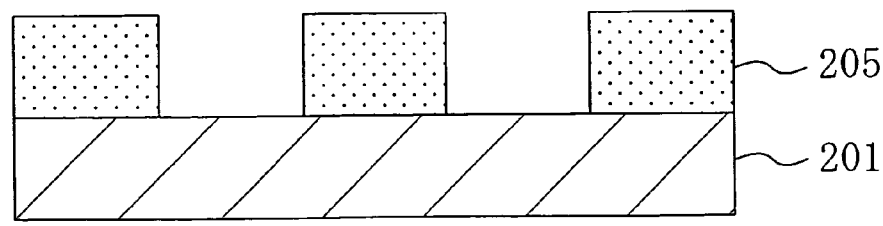

After the pattern exposure, as shown in FIG. 3C, the resist film 202 is baked with a hot plate at a temperature of 120° C. for 90 seconds, and the resultant resist film is developed with a 2.38 wt % tetramethylammonium hydroxide developer (alkaline developer). In this manner, a resist pattern 205 made of the exposed portion 202a of the resist film 202 and having a line width of 0.09 μm can be formed in a good shape as shown in FIG. 3D.

In Embodiment 2, since the solution 203 includes the antifoaming agent, foams formed in moving the stage for holding the substrate 201 can be vanished by the antifoaming agent. As a result, the exposing light 204 can be prevented from scattering, so that the resist pattern 205 can be formed in a good shape.

Examples of the antifoaming agent included in the solution 103 or 203 in the pattern formation method of Embodiment 1 or 2 are a foam breaker, a foam inhibitor and a defoaming agent, which does not limit the invention. A foam breaker is adsorbed onto a foam and enters the surface film of the foam through the function of surface tension. Thereafter, the foam breaker expands over the surface film of the foam through the surface tension, and this reduces the thickness of the surface film, so that the surface film can be ultimately broken. A foam inhibitor is adsorbed onto the surface film of a foam together with a foaming substance in a solution. When the foam inhibitor is adsorbed, the surface tension of the surface film of the foam is lowered, so as to reduce the thickness of the surface film. Therefore, the foam becomes unstable and breaks when it reaches the solution surface. A defoaming agent is adsorbed onto the surface film of a foam in a solution. When such foams are adsorbed to one another in the solution, the foams are broken on the adsorbed interfaces, and hence, the foams are combined to form a large foam. The large foam has a large ascending force and hence ascends to the solution surface at a high speed.

The antifoaming agent may be but is not limited to silicone oil, fatty acid, phosphoric ester, vegetable fat, glycerol fatty ester, calcium carbonate, magnesium carbonate, lecithin or polyether.

A sufficient effect can be generally attained when the content of the antifoaming agent is approximately several p.p.m. through 1%, and the content may be larger or smaller.

In consideration of light transmittance, in the case where the exposing light 104 or 204 is UV, such as a g-line or an i-line, or far UV, such as KrF excimer laser or ArF excimer laser, the solution 103 or 203 is preferably water (having a refractive index n of 1.44), and in the case where the exposing light 104 or 204 is vacuum UV such as $F_2$ laser, the solution 103 or 203 is preferably perfluoropolyether (having a refractive index n of 1.37).

Embodiment 3

First, a second exposure system used in a pattern formation method according to Embodiment 3 of the invention will be described with reference to FIG. 4.

As shown in FIG. 4, a projection lens 22 of the second exposure system is provided above a resist film 21 formed on a semiconductor substrate 20, and a solution storage 24 for storing a solution 23 (with a refractive index n) is provided between the projection lens 22 and the resist film 21. The solution storage 24 is provided with an inlet 24a for allowing the solution 23 to flow into and an outlet 24b for allowing the solution 23 to flow out of the solution storage 24, and the solution 23 having flown into the solution storage 24 through the inlet 24a is temporarily stored in the solution storage 24 and then flows out through the outlet 24b. Accordingly, the numerical aperture NA of exposing light 25 that reaches the surface of the resist film 21 through the solution 23 has a value "n" times as large as that attained when the exposing light reaches without passing through the solution 23.

In the second exposure system, the outlet 24b has a smaller cross-sectional area than the inlet 24a. Therefore, the pressure of the solution 23 stored in the solution storage 24 is higher than the pressure of the solution 13 stored in the solution storage 14 of the first exposure system in which the outlet 14b and the inlet 14a have the same cross-sectional area. Accordingly, foams formed in the solution 23 in moving a stage for holding the substrate 20 can be rapidly vanished, and hence, the foams formed within the solution 23 can be reduced.

The outlet 24b can be provided with a smaller cross-sectional area than the inlet 24a as follows: In the case where the outlet 24b and the inlet 24a are the same in number, the cross-sectional area of each outlet 24b is set to be smaller than that of each inlet 24a. In the case where the outlet 24b and the inlet 24a are the same in the cross-sectional area, the number of outlets 24b is set to be smaller than the number of inlets 24a.

The pattern formation method according to Embodiment 3 of the invention will now be described with reference to FIGS. 5A through 5D.

First, a chemically amplified resist material having the following composition is prepared:

| | |
|---|---|
| Base polymer: poly((norbornene-5-methylene-t-butylcarboxylate) – (maleic anhydride)) (wherein norbornene-5-methylene-t-butylcarboxylate:maleic anhydride = 50 mol %:50 mol %) | 2 g |
| Acid generator: trifluorosulfonium triflate | 0.04 g |
| Solvent: propylene glycol monomethyl ether acetate | 20 g |

Figure 5A:
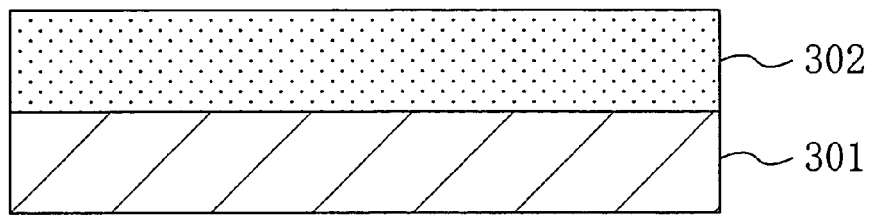
FIGS. 5A, 5B, 5C and 5D are cross-sectional views for showing procedures in the pattern formation method according to Embodiment 3 of the invention.

Next, as shown in FIG. 5A, the aforementioned chemically amplified resist material is applied on a substrate 301 so as to form a resist film 302 with a thickness of 0.35 μm.

Figure 5B:
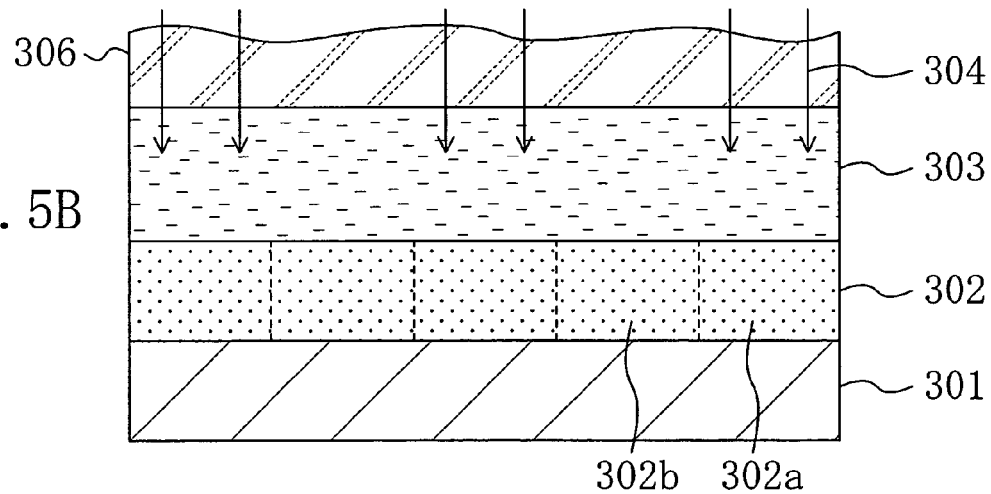

Then, as shown in FIG. 5B, while supplying, between a projection lens 306 and the resist film 302, a solution 303 of water that is circulated and temporarily stored in the solution storage 24 (shown in FIG. 4), pattern exposure is carried out by irradiating the resist film 302 with exposing light 304 of ArF excimer laser with NA of 0.65 through a mask not shown. Thus, an exposed portion 302a of the resist film 302 becomes soluble in an alkaline developer because an acid is generated from the acid generator therein while an unexposed portion 302b of the resist film 302 remains insoluble in an alkaline developer because no acid is generated from the acid generator therein.

Figure 5C:
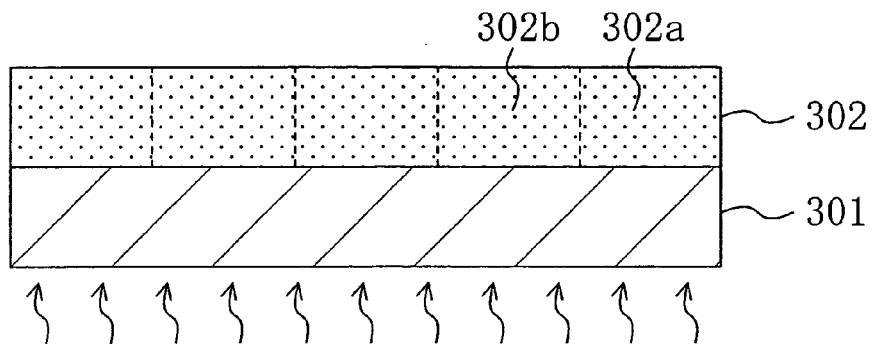
Figure 5D:
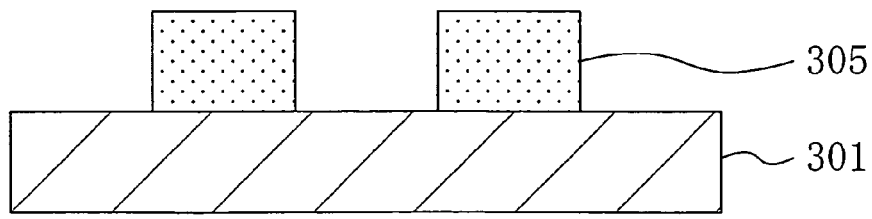

After the pattern exposure, as shown in FIG. 5C, the resist film 302 is baked with a hot plate at a temperature of 100° C. for 60 seconds, and the resultant resist film is developed with a 2.38 wt % tetramethylammonium hydroxide developer (alkaline developer). In this manner, a resist pattern 305 made of the unexposed portion 302b of the resist film 302 and having a line width of 0.09 μm can be formed in a good shape as shown in FIG. 5D.

In Embodiment 3, since the cross-sectional area of the outlet 24b for allowing the solution to flow out of the solution storage 24 is smaller than that of the inlet 24a for allowing the solution to flow into the solution storage 24 in the second exposure system, the pressure of the solution 303 temporarily stored in the solution storage 24 is high. Therefore, the size of foams formed in the solution 303 is reduced and the formed foams are rapidly vanished. As a result, the exposing light 304 can be prevented from scattering, so that the resist pattern 305 can be formed in a good shape.

Embodiment 4

A pattern formation method according to Embodiment 4 of the invention will now be described with reference to FIGS. 6A through 6D. In the pattern formation method of Embodiment 4, the second exposure system shown in FIG. 4 is used as in Embodiment 3.

First, a negative chemically amplified resist material having the following composition is prepared:

| | |
|---|---|
| Base polymer: poly((norbornene-5-methylenecarboxylate) – (maleic anhydride)) (wherein norbornene-5-methylenecarboxylate:maleic anhydride = 50 mol %:50 mol %) | 2 g |
| Crosslinking agent: 1,3,5-N-(trihydroxymethyl)melamine | 0.7 g |
| Acid generator: trifluorosulfonium triflate | 0.04 g |
| Solvent: propylene glycol monomethyl ether acetate | 20 g |

Figure 6A:
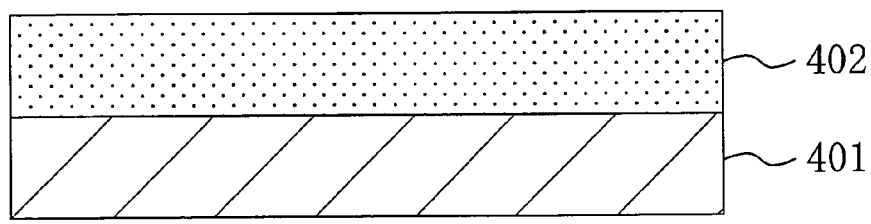
FIGS. 6A, 6B, 6C and 6D are cross-sectional views for showing procedures in the pattern formation method according to Embodiment 4 of the invention.

Next, as shown in FIG. 6A, the aforementioned chemically amplified resist material is applied on a substrate 401 so as to form a resist film 402 with a thickness of 0.35 μm.

Figure 6B:
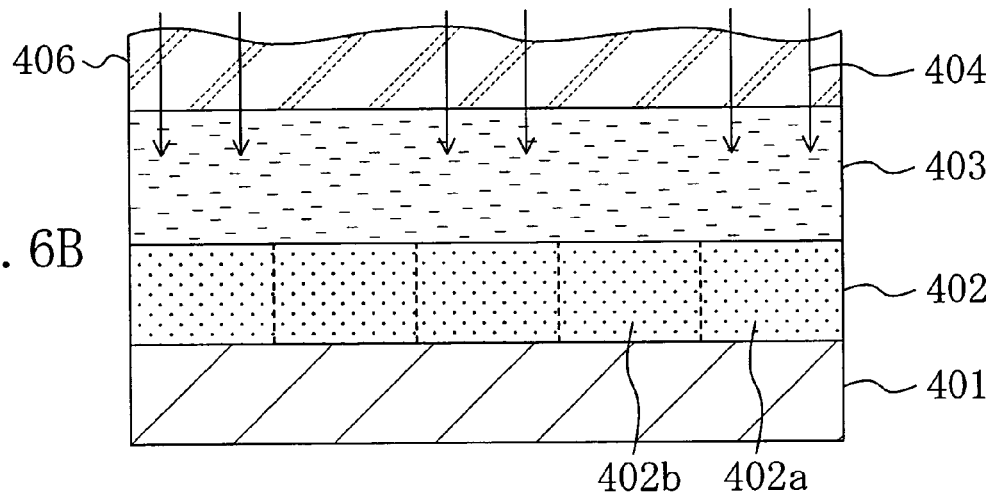

Then, as shown in FIG. 6B, while supplying, between a projection lens 406 and the resist film 402, a solution 403 of water that is circulated and temporarily stored in the solution storage 24 (shown in FIG. 4), pattern exposure is carried out by irradiating the resist film 402 with exposing light 404 of ArF excimer laser with NA of 0.65 through a mask not shown. Thus, an exposed portion 402a of the resist film 402 becomes insoluble in an alkaline developer due to the function of the crosslinking agent because an acid is generated from the acid generator therein while an unexposed portion 402b of the resist film 402 remains soluble in an alkaline developer because no acid is generated from the acid generator therein.

Figure 6C:
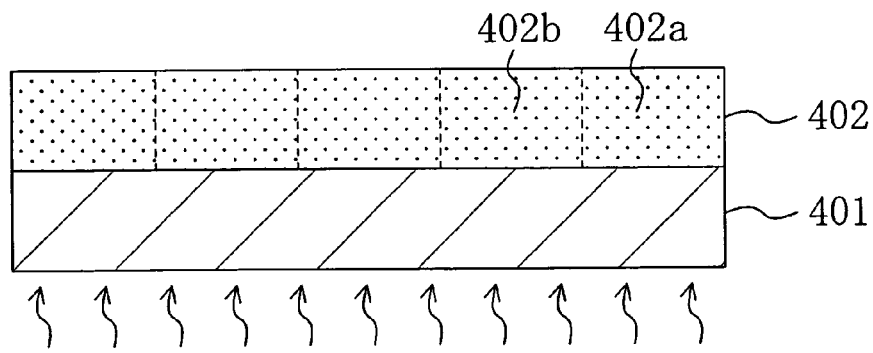
Figure 6D:
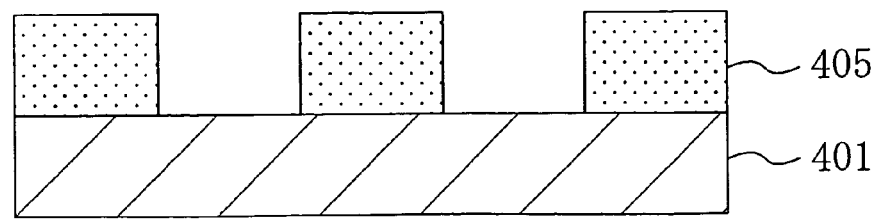
Figure 7A:
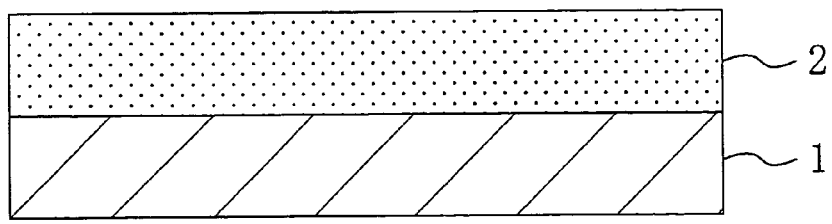
FIGS. 7A, 7B, 7C and 7D are cross-sectional views for showing procedures in a conventional pattern formation method.
Figure 7B:
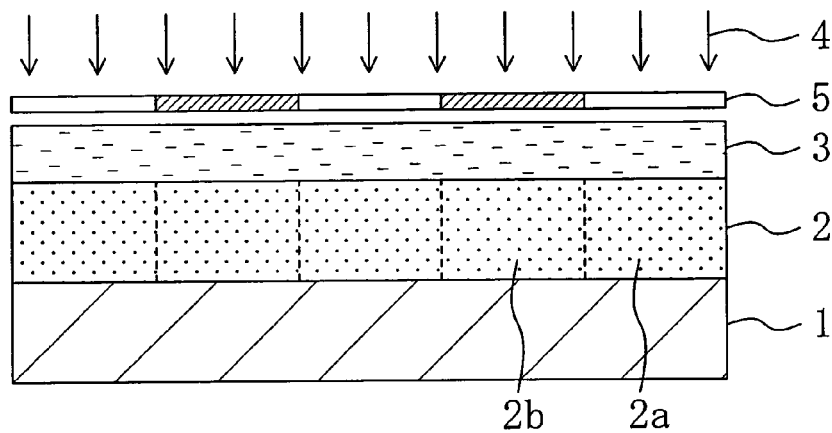
Figure 7C:
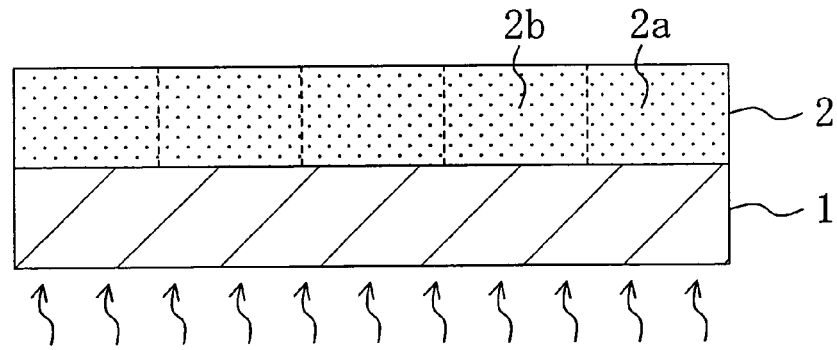
Figure 7D:
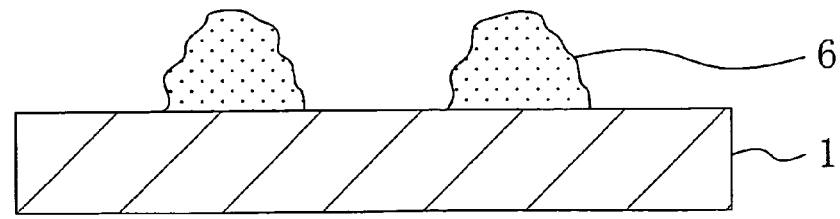

After the pattern exposure, as shown in FIG. 6C, the resist film 402 is baked with a hot plate at a temperature of 120° C. for 90 seconds, and the resultant resist film is developed with a 2.38 wt % tetramethylammonium hydroxide developer (alkaline developer). In this manner, a resist pattern 405 made of the exposed portion 402a of the resist film 402 and having a line width of 0.09 μm can be formed in a good shape as shown in FIG. 6D.

In Embodiment 4, since the cross-sectional area of the outlet 24b for allowing the solution to flow out of the solution storage 24 is smaller than that of the inlet 24a for allowing the solution to flow into the solution storage 24 in the second exposure system, the pressure of the solution 403 temporarily stored in the solution storage 24 is high. Therefore, the size of foams formed in the solution 403 is reduced and the formed foams are rapidly vanished. As a result, the exposing light 404 can be prevented from scattering, so that the resist pattern 405 can be formed in a good shape.

Although the solution 303 or 403 of Embodiment 3 or 4 does not include an antifoaming agent, it may include an antifoaming agent similar to that used in Embodiment 1 or 2. Thus, the foams formed in the solution 303 or 403 can be more rapidly vanished.

What is claimed is:

1. A pattern formation method comprising the steps of:
performing pattern exposure by selectively irradiating a resist film with exposing light while supplying a solution onto said resist film; and
forming a resist pattern by developing said resist film after the pattern exposure,
wherein, in the step of performing pattern exposure, said solution supplied onto said resist film is temporarily stored in a solution storage that is provided between said resist film and a lens used for projecting said exposing light to said resist film and has an inlet for allowing said solution to flow in and an outlet, having a cross-sectional area smaller than said inlet, for allowing said solution to flow out.

2. The pattern formation method of claim 1, wherein said solution is water.

3. The pattern formation method of claim 1, wherein said solution is perfluoropolyether.

4. The pattern formation method of claim 1, wherein said solution includes an antifoaming agent.

5. The pattern formation method of claim 4, wherein said antifoaming agent is silicone oil, fatty acid, phosphoric ester, vegetable fat, glycerol fatty ester, calcium carbonate, magnesium carbonate, lecithin or polyether.

* * * * *